United States Patent [19]
Dunne

[11] Patent Number: 6,043,868
[45] Date of Patent: *Mar. 28, 2000

[54] DISTANCE MEASUREMENT AND RANGING INSTRUMENT HAVING A LIGHT EMITTING DIODE-BASED TRANSMITTER

[75] Inventor: Jeremy G. Dunne, Littleton, Colo.

[73] Assignee: Laser Technology, Inc., Englewood, Colo.

[*] Notice: This patent is subject to a terminal disclaimer.

[21] Appl. No.: 09/238,349

[22] Filed: Jan. 27, 1999

Related U.S. Application Data

[63] Continuation of application No. 08/904,194, Jul. 31, 1997, Pat. No. 5,889,583, which is a continuation-in-part of application No. 08/702,365, Aug. 23, 1996, Pat. No. 5,790,244.

[51] Int. Cl.[7] .................................................. G01C 3/08
[52] U.S. Cl. ..................... 356/5.01; 327/314; 327/325; 250/214 R
[58] Field of Search .................... 356/5.01–5.09; 327/514, 314, 325; 250/214 R, 214 LA

[56] References Cited

U.S. PATENT DOCUMENTS

| | | | |
|---|---|---|---|
| 4,521,107 | 6/1985 | Chaborski et al. | ........................ 356/5 |
| 5,089,727 | 2/1992 | Molitor et al. | ........................ 356/5 X |
| 5,121,401 | 6/1992 | Dahl | ........................ 356/5 X |
| 5,278,423 | 1/1994 | Wangler et al. | ........................ 356/4 X |
| 5,359,404 | 10/1994 | Dunne | ........................ 356/5 |
| 5,428,439 | 6/1995 | Parker et al. | ........................ 356/5.01 |
| 5,548,112 | 8/1996 | Nakase et al. | ........................ 250/214 |
| 5,578,815 | 11/1996 | Nakase et al. | ........................ 250/214 |
| 5,652,651 | 7/1997 | Dunne | ........................ 356/5.01 |
| 5,790,244 | 8/1998 | Dunne | ........................ 356/5.01 |

*Primary Examiner*—Joseph L. Felber
*Attorney, Agent, or Firm*—William J. Kubida; Carol W. Burton; Hogan & Hartson LLP

[57] ABSTRACT

A circuit and apparatus for generating a light pulse from an inexpensive light-emitting diode (LED) for an accurate distance measurement and ranging instrument comprises an LED and a firing circuit. An optional pre-biasing circuit provides a reverse-bias signal to the LED to ensure the LED does not begin to emit light before a firing circuit can provide a sufficiently high current pulse of short duration as a forward current through the LED. The LED is driven by the firing circuit with a pulse of high peak power and short duration. The resulting light pulse from the LED can be inexpensively used to derive distance and ranging information for use in a distance measurement and ranging device.

6 Claims, 7 Drawing Sheets

DISTANCE MEASUREMENT AND RANGING INSTRUMENT HAVING A LIGHT EMITTING DIODE-BASED TRANSMITTER

CROSS REFERENCE TO RELATED APPLICATIONS

This application is a continuation of U.S. patent application Ser. No. 08/904,194, filed Jul. 31, 1997, now U.S. Pat. No. 5,889,583 which is a continuation-in-part of U.S. patent application Ser. No. 08/702,365 for "Pre-biasing Technique for a Transistor Based Avalanche Circuit in a Laser Based Distance Measurement and Ranging Instrument" filed Aug. 23, 1996, now U.S. Pat. No. 5,790,244 and assigned to the assignee of the present invention, Laser Technology, Inc., Englewood, Colo.

The present invention is related to the subject matter disclosed and claimed in U.S. patent application Ser. No. 08/702,366 for "High Efficiency Voltage Conversion Circuit for a Laser Based Distance Measurement and Ranging Instrument" filed Aug. 23, 1996; U.S. Pat. No. 5,652,651 for "Laser Range Finder Having Selectable Target Acquisition Characteristics and Range Measuring Precision"; and U.S. Pat. No. 5,359,404 for "Laser-Based Speed Measuring Device"; all assigned to the assignee of the present invention, Laser Technology, Inc., Englewood, Colo., the disclosures of which are hereby specifically incorporated in their entirety by this reference.

FIELD OF THE INVENTION

The present invention relates, in general, to the field of distance or range measuring equipment. More particularly, the present invention relates to the use of an inexpensive light-emitting diode (LED), in place of a laser diode, in a distance measuring and ranging instrument which may be inexpensively produced yet provides highly accurate precision range measurements.

BACKGROUND OF THE INVENTION

Laser-based distance and range measuring equipment have been used for a number of years to provide extremely accurate distance measurements to a remote target or object. A representative instrument is the Criterion™ 100 laser range finder developed and marketed by Laser Technology, Inc., assignee of the present invention. Although a highly accurate and reliable device, its great distance ranging capability and inherent complexity translates to a manufacturing cost and form factor most suitable only for certain specific applications.

Distances are determined by calculating the time of flight of a laser pulse from the instrument to the target and back and this elapsed time measurement is referenced with respect to a signal from an optical pick-up sensor mounted in the laser transmission path.

While these distance measuring and ranging devices have conventionally used laser diodes for generating the light pulses from which the distance and range measurements are derived, laser diodes are generally expensive components, costing approximately $7.00 to $50.00 depending on the type and quality of the laser diode.

However, while distance measuring and ranging instruments require a high degree of predictability in the optical pulses which they use to derive distance and range information, LEDs have the inherent problem of a variable delay time between the drive current and the optical output dependent on the magnitude of the drive current and the temperature.

A need therefore exists for a range finder which can be economically manufactured as a light weight, rugged and compact unit to nevertheless provide extremely accurate distance measurement capabilities across a wide range of potential applications.

SUMMARY OF THE INVENTION

The present invention both utilizes an LED within a distance measuring and ranging instrument as well as provides firing circuit and an optional pre-bias circuit which reduces uncertainty as to the firing point of the LED. In this manner, an inexpensive LED can be used in a distance measuring and ranging instrument without compromising the accuracy of such an instrument.

Disclosed herein is a circuit for inexpensively generating a light pulse for a distance and ranging instrument, or other similar application. The circuit comprises a light-emitting diode (LED) element for generating the light pulse when the LED is forward biased. An optional pre-biasing circuit, coupled to the LED, provides a reverse-bias signal to the LED prior to firing the LED. A firing circuit, coupled to the LED, applies a forward-bias signal to the LED. The forward bias signal can be a high current pulse signal of short duration (i.e., on the order of 40 amperes in 50 nanoseconds or less) to generate the proper light pulse output from the LED.

The firing circuit can be implemented as an avalanche transistor based firing circuit, a MOSFET-based firing circuit, an SCR based firing circuit, or a discrete transistor pair firing circuit.

The optional pre-biasing technique for an LED firing circuit disclosed herein improves the initial rate of rise in the current applied through the LED in a distance measurement and ranging instrument and, therefore, improves the sharpness of the leading edge of the light pulse produced. Since the timing of the flight time of a light pulse to a target and back to the ranging instrument is determined with reference to the leading edge of the emitted light pulse, the inherent precision obtainable is enhanced by the production of a sharper leading edge pulse.

Through the use of the pre-biasing technique disclosed coupled with the firing circuits disclosed, a very rapid rise-time pulse may be achieved which permits the substitution of a much cheaper LED, on the order of $0.60–$0.70 each, in lieu of a conventional laser diode, on the order of $7.00 each or more, in a distance measuring and ranging instrument.

A ranging instrument for measuring a distance to a target can incorporate the LED, the firing circuits, and the optional pre-biasing circuit disclosed herein. The ranging instrument has a transmit circuit section for generating a light pulse of known wavelength with the LED. A firing circuit generates a drive pulse of short duration and high peak power to drive the LED. The ranging instrument also has a receive circuit section for detecting a reflection of the light pulse from the target, and a ranging section for calculating a distance from the ranging device to the target.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

The present invention discloses the use of an LED in a distance measuring and ranging instrument application, along with a circuit to pre-bias the LED and various embodiments of circuits to drive or fire the LED for generating a light pulse from which distance and range information can be derived.

Figure 1:
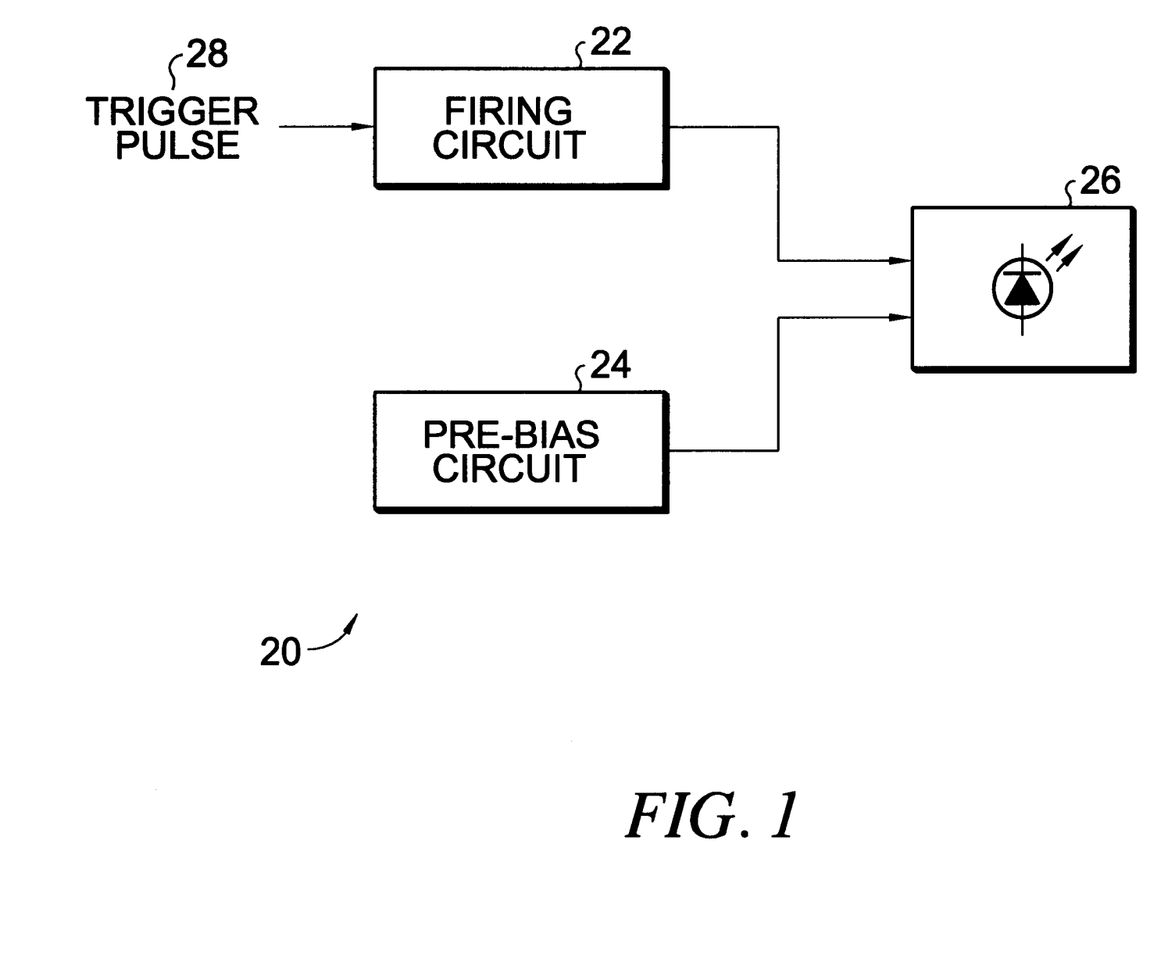
FIG. 1 illustrates a block diagram of a transmitting section having a light emitting diode (LED) in a distance measurement and ranging instrument in accordance with the present invention.
Figure 2:
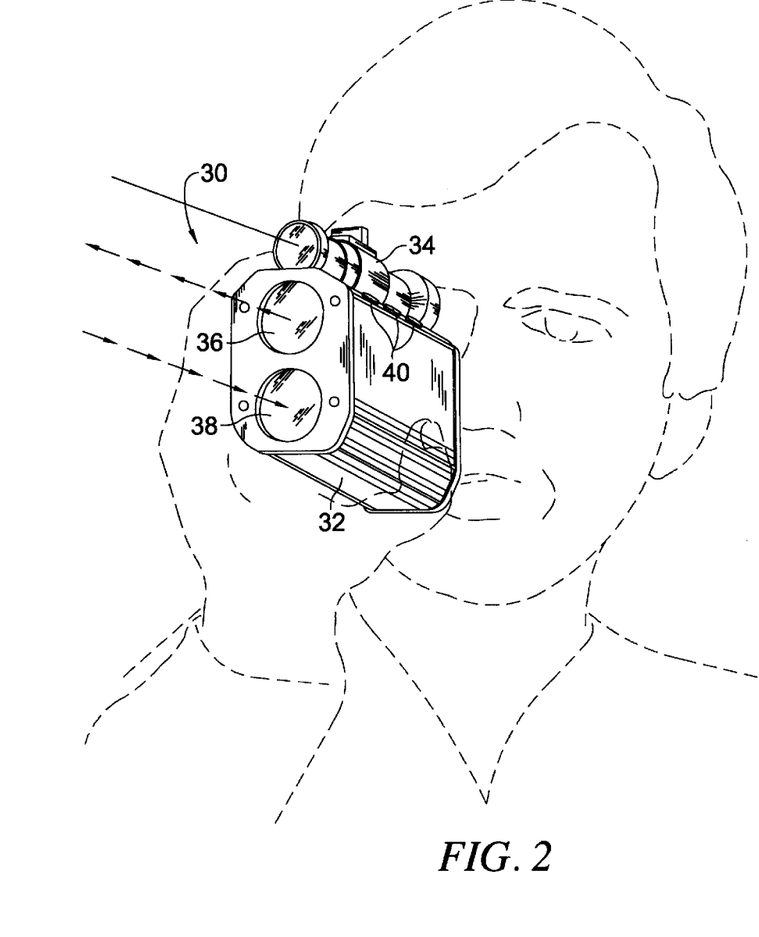
FIG. 2 is a perspective view of a representative distance measuring and ranging instrument in accordance with a particular application of the present invention.

FIG. 1 illustrates a block diagram of a transmit section 20 of a distance measuring and ranging instrument 30 shown in FIG. 2. Referring to FIG. 1, the transmit section 20 has a firing circuit 22 and a light emitting diode (LED) 26 for generating an optical pulse from which distance and ranging information is derived. An optional pre-biasing circuit can be provided to controllably bias the LED prior to its firing. Firing circuit 22 is responsive to a trigger pulse 28 initiated generally by a user of the distance measuring and ranging instrument.

The firing circuit 22 is a circuit which is designed to supply a high current to LED 26 for some fixed period of time. Pre-bias circuit 24 helps to eliminate the uncertainties of the resulting optical pulse of LED 26 by ensuring that LED 26 does not begin forward conduction until firing circuit 22 has developed a sufficient amount of energy to transfer to the LED. Pre-bias circuit 24 will be discussed in greater detail in conjunction with FIG. 3. Various embodiments of firing circuit 22 are shown and discussed in relation to FIG. 3, 4, 5, and 6.

The present invention can be used in a ranging instrument or in an extremely low cost light-based tape measure design. FIG. 2 shows a distance measuring and ranging instrument 30 incorporating the transmit section 20 having LED 26 of the present invention. The instrument 30 includes a housing 32 which is capable of being held in one hand of a user while sighting a target substantially as illustrated. The housing 32 encloses the electronic and optical components of the instrument 30 inclusive of the battery based power source.

An instrument sight 34 (which may include a sighting reticle with a head-up display including alphanumeric or graphic representations of distances to a remote object) may be affixed to an upper portion of the housing 32 to enable a user to aim the instrument 30 towards a desired target. A signal transmitting aperture 36 and adjacent reflected signal receiving aperture 38 respectively allow for the transmission and reception of signals to enable the instrument 30 to accurately determine distances to a target from which the transmitted signal is reflected back to the instrument 30 by calculation of the signal time-of-flight. A plurality of selection switches 40, (which, in the embodiment shown, may be duplicated at two locations on the housing 32 so as to be readily accessible in either right-handed or left-handed modes of operation) allow a user to select particular features or operating modes of the instrument 30.

While FIG. 2 illustrates a device having an optical sight 34, it is understood that a simpler version of instrument 30 could be utilized without an optical sight 34. For instance, in accordance with the present invention, a hand-held optical tape measure could also employ a transmit section having an LED and a firing circuit to drive the LED. Conventional electronic tape measuring devices utilize ultrasound which have a 7 to 10 degree beam pattern. An LED advantageously has a 2 to 4 degree beam pattern, and has the further benefit of not being dependant on fluctuations in pressure or temperate as ultrasound tape measure devices.

Figure 3:
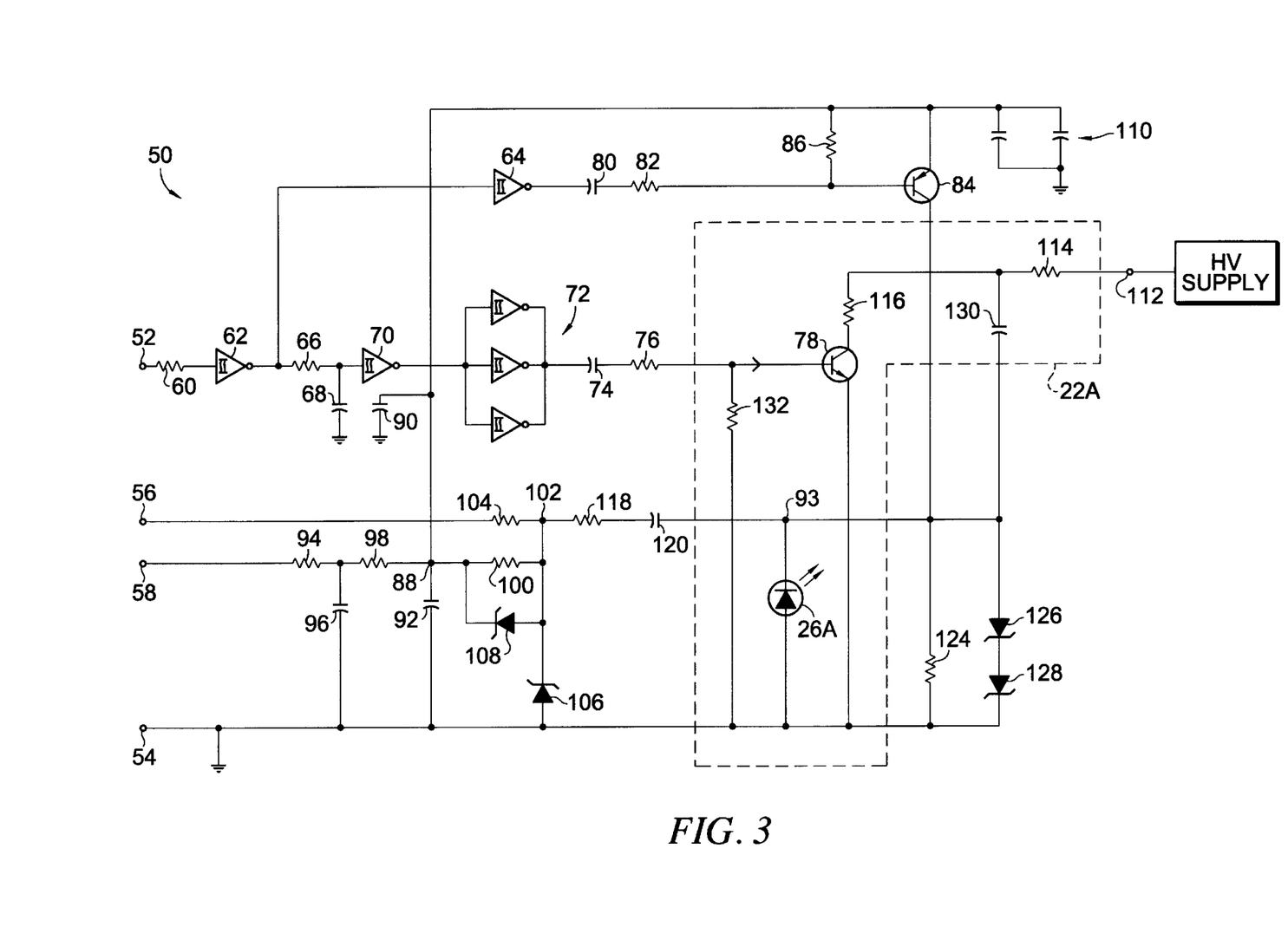
FIG. 3 is a detailed schematic illustration of a particular embodiment of a circuit implementing a pre-biasing technique for firing an LED to generate an optical pulse in accordance with the present invention, as well as an avalanche transistor based firing circuit for an LED.
Figure 4:
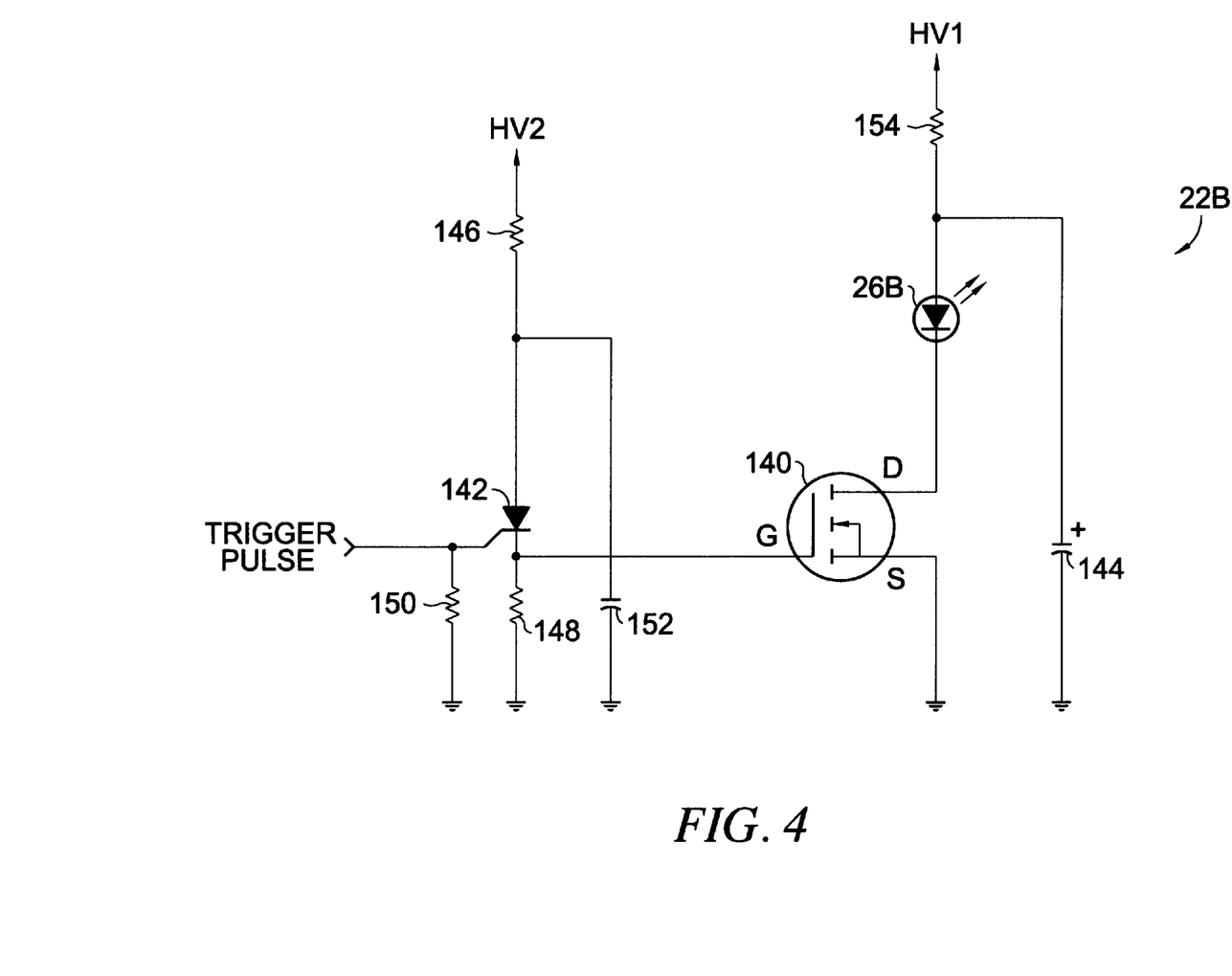
FIG. 4 illustrates an embodiment of the present invention wherein a MOSFET is used to fire the LED in accordance with the present invention.
Figure 5:
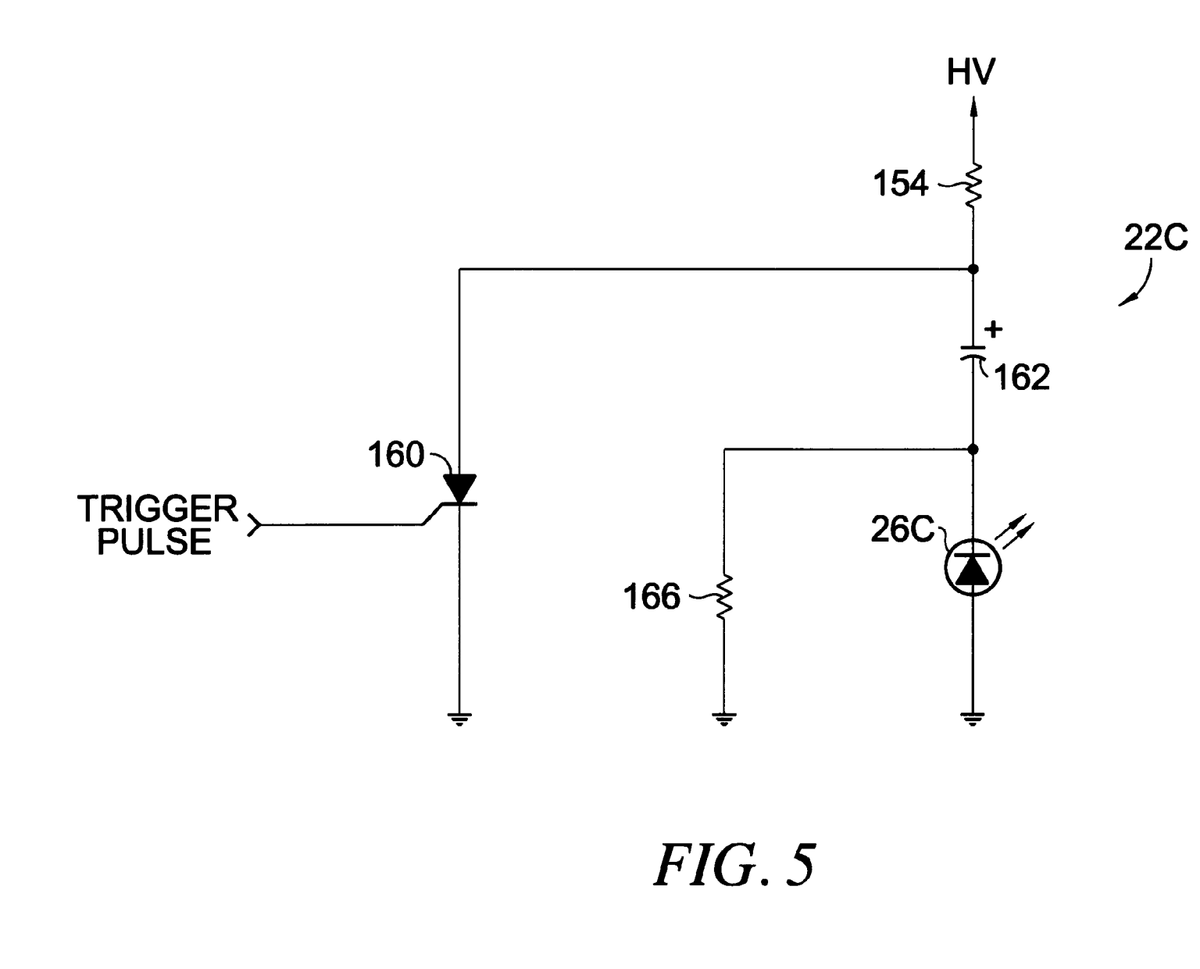
FIG. 5 illustrates an embodiment of the present invention wherein a silicon controlled rectifier (SCR) is used to control the firing of an LED in accordance with the present invention.
Figure 6:
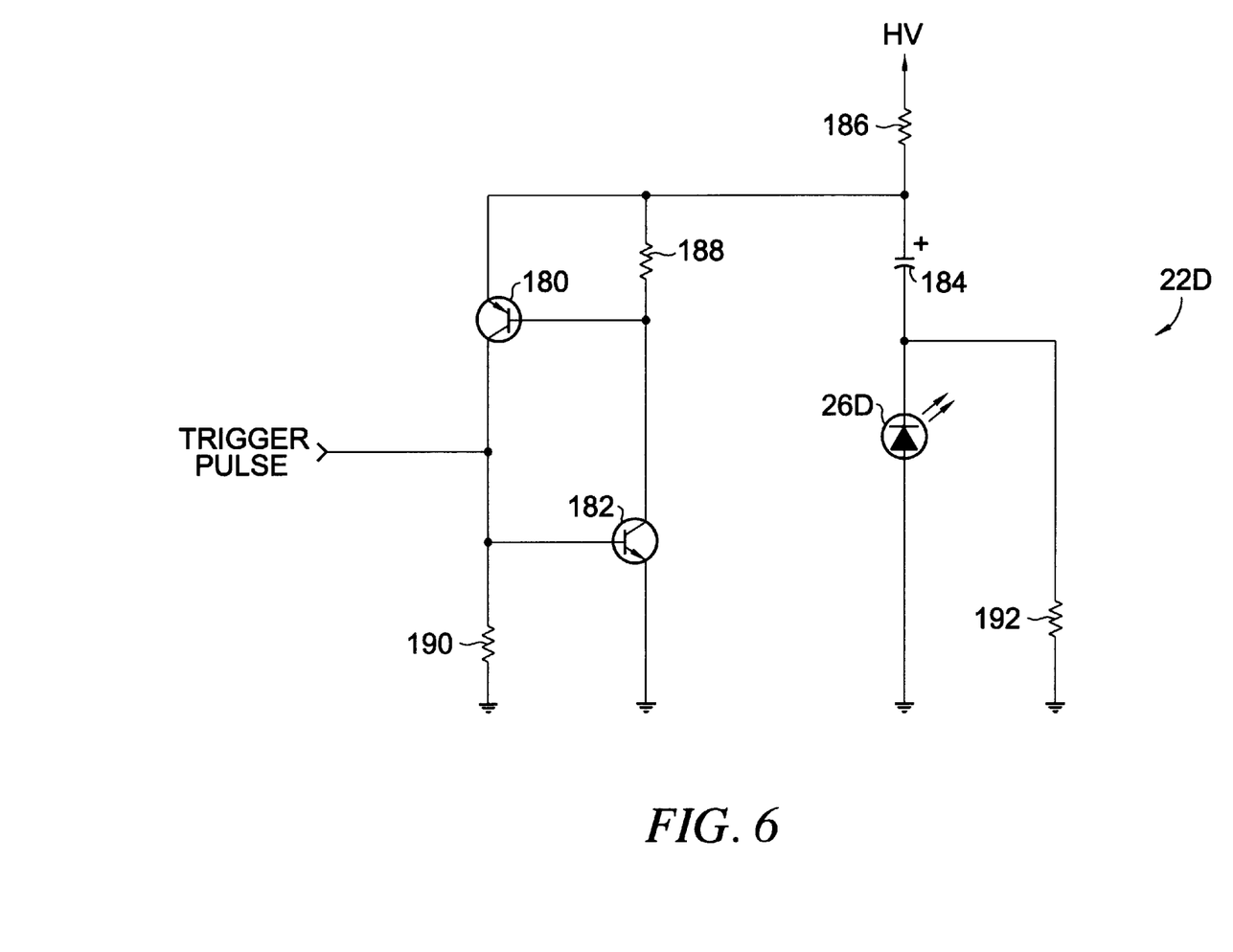
FIG. 6 illustrates an embodiment of the present invention wherein two transistors are configured to fire an LED in accordance with the present invention.

FIG. 3 shows both a pre-biasing circuit 50 coupled to a firing circuit 22A for firing LED 26A. The firing circuit 22A is coupled to LED 26A and employs an avalanche transistor 78, capacitor 130, resistor 132, transistor 78, resistor 116, resistor 114 coupled to high voltage supply 112. As will be described below, firing circuit 22A generally applies a high pulse of current, approaching 40 amperes, as a forward current through LED 26A from capacitor 130 and high voltage supply 112 when transistor 78 is turned on, thereby generating a light pulse from LED 26A. FIGS. 4, 5, and 6 show different embodiments of a firing circuit for an LED.

The optional pre-biasing circuit 50 of FIG. 3 is a current sourcing circuit composed of PNP transistor 84, resistor 124, diodes 126 and 128, and supply input 58. Furthermore, inverters 62, 64, 70, and 72 are used for timing purposes as will be described below. The pre-biasing circuit 50 of the present invention effectively provides a predetermined amount of reverse current into the Schottky diode clamp in parallel with the LED such that the LED will not begin generating an optical emission until its forward current has exceeded the predetermined reverse current. In this manner, the pre-bias circuit of the present invention establishes a known and predictable threshold at which the LED begins to generate the optical pulse from which the distance and range information can be later derived.

In operation, the pre-bias circuit provides a fixed pre-bias current from the collector of PNP transistor 84 through resistor 124 and clamping diodes 126 and 128. LED 26A is therefore reversed biased by the forward voltage of the Schottky clamp. LED 26A will therefore only begin its optical emissions after the drive current exceeds the predetermined fixed reverse bias current provided by the pre-bias section.

The avalanche transistor based firing circuit 22A receives a trigger pulse at the base of transistor 78 after a series of predetermined delays through the Schmitt trigger gates 62, 70, and 72. When the LED is not being fired, high voltage capacitor 130 charges to approximately the voltage of high voltage supply 112 through resistor 114. When the trigger signal to the base of transistor 78 turns transistor 78 on, the charge stored in capacitor 130 discharges through transistor 78 to ground and provides a forward current through LED 26A. However, because of the pre-bias current provided by PNP transistor 84, LED 26A does not begin to emit light until the forward current through avalanche transistor 78 exceeds the pre-biasing reverse current. Because of the substantial amount of forward current transferred through LED 26A from capacitor 130, LED 26A emits a optical pulse with a very short rise time and a very sharp leading edge.

In general, the shorter the pulse width generated by the LED, the better the performance and degree of precision the distance and ranging calculations. Furthermore, for power consumption purposes, shorter pulse widths are associated with higher efficiencies because less energy is dissipated through the LED. The avalanche transistor firing circuit 22A in FIG. 3 can generate 15 nanosecond pulses from the LED 26A.

An LED manufactured by Hewlett Packard, Model HSDL-4200, can be used as LED 26, 26A, 26B, 26C, or 26D (FIGS. 1, 3, 4, 5, and 6). It has been found that this HP LED can reliably operate with a 40 amp current pulse through it. The LED is driven by firing circuit 22A over its rated current but within its rated temperature so as to maintain its lifetime. While this particular LED is also rated as having a 40 nanosecond rise time, it has been found that when used in conjunction with the pre-biasing circuit of FIG. 3 and the avalanche-transistor firing circuit 22A of FIG. 3, a 15 nanosecond optical pulse can be generated from the LED.

Node 56 of pre-biasing circuit 50 is a timing reference output otherwise utilized by a the ranging device to determine when LED 26A has been fired. Input 52 is coupled through a resistor 60 to one Schmitt trigger inverter 62 which, in turn, has an output thereof coupled to an input of an additional Schmitt trigger inverter 64. The output of Schmitt trigger inverter 62 is coupled through a resistor 66 to another Schmitt trigger inverter 70, and to circuit ground through a capacitor 68. The output of Schmitt trigger inverter 70 is coupled to the inputs of three Schmitt trigger inverters 72 having their outputs coupled together as shown. In a preferred embodiment, the Schmitt trigger inverters 62, 64, 70 and 72 may be conveniently furnished as portions of an extremely fast 74AC14 hex Schmitt trigger integrated circuit. The resistor 60 may comprise a 120 ohm device while the resistor 66 may comprise a 390 ohm device. Capacitor 68 may be 100 pf.

The output of the parallel connected Schmitt trigger inverters 72 are coupled through a capacitor 74 and series connected resistor 76 to the base terminal of NPN avalanche transistor 78, as shown. Avalanche transistor 78 has its emitter terminal coupled to input 54 at circuit ground. The output of Schmitt trigger inverter 64 is coupled through capacitor 80 and series connected resistor 82 to the base terminal of PNP pre-bias transistor 84. The emitter terminal pre-bias transistor 84 is coupled back to the base terminal thereof through resistor 86. The emitter terminal of transistor 84 defines a node 88 which is coupled to circuit ground through capacitor 90, as shown. In a preferred embodiment, capacitor 74 may have a value of 10 nf, resistor 76 a value of 10 ohms, and transistor 78 may be conveniently furnished as a relatively inexpensive ZTX415 device. In like manner, capacitor 80 may have a value of 2 nf while resistor 82 has a value of 56 ohms. Transistor 84 may be conveniently furnished as a FMMT591 device while resistor 86 has a value of 100 ohms. Capacitor 90 may have a value of 0.1 uf.

Node 88 is also coupled to ground input 54 through capacitor 92. Input 58 is connected to node 88 through series connected resistors 94, 98, having the node therebetween coupled to input 54 through capacitor 96. In a preferred embodiment, capacitors 92 and 96 may have values of 10 uf while resistors 94 and 98 have a value of 47 ohms. Node 88 is also coupled through resistor 100 to node 102 which, in turn, is coupled to input 56 through resistor 104. Resistor 100 may have a value of 470 ohms while resistor 104 may have a value of 120 ohms. Schottky diode 106 has its anode coupled to ground input 54 and its cathode coupled to node 102, as well as the anode of Schottky diode 108 which, in turn, has its cathode coupled to node 88. Schottky diodes 106 and 108 may be conveniently furnished as BAT54S devices.

Parallel connected capacitors 110 couple the emitter terminal of PNP transistor 84 to circuit ground, as shown, and may comprise individual 0.1 uf devices.

An additional high voltage input 112 is coupled through series connected resistors 114 and 116 to the collector terminal of avalanche transistor 78, as shown. The high voltage input 112 may be, for example, between 200 volts to 300 volts or greater. Resistor 114 may have a value of 100 Kohms and resistor 116 has a value of 1.0 ohm.

Resistor 118 and series connected capacitor 120 connect node 102 to the anode of Schottky diode 126 with Schottky diode 128 having its cathode connected to circuit ground at input 54. Resistor 118 may have a value of 470 ohms while capacitor 120 may have a value of 100 pf. Schottky diodes 126, 128 may be conveniently furnished as MBR0540 devices. The anode of Schottky diode 126 is coupled to ground input 54 through resistor 124, as well as directly to the collector terminal of PNP transistor 84. As shown, the emitter terminal of NPN transistor 78 is connected to ground input 54 while the base terminal thereof is coupled through resistor 132 to ground input 54. A capacitor 130 couples the anode of Schottky diode 126 to the node between resistors 114 and 116. LED 26A has its anode coupled to ground input 54 and its cathode coupled to the anode of Schottky diode 126. In a preferred embodiment, resistors 124 and 132 may have a value of 47 and 100 ohms respectively while capacitor 130 has a value of 10 nf.

In general, a transistor avalanche circuit functions by charging a capacitor (such as capacitor 130) to a high positive potential. Placing a signal at the base of the avalanche transistor (such as transistor 78) causes it to turn on and function as a switch allowing current to flow out of the capacitor and through the light emitting device (such as LED 26A). However, the collector current in the avalanche transistor requires an indeterminate initial build-up delay of anywhere between 2 and 15 nanoseconds before 1–2 amps of current can begin to flow followed by a relatively much smaller additional time before an avalanche condition is reached at about 40 amps. Moreover, this 2–15 nanosecond operating region is highly temperature dependent. When used in conjunction with an LED which itself exhibits an inherent emission lag time, unacceptably high delay and uncertainty as to operation can occur in conventional avalanche circuits in a precision instrument.

Nevertheless, the advantages of using an avalanche transistor to switch power through an LED in such a manner are its inherently low component cost and relatively fast operation. However, as previously described, for a period of its initial operating region it functions primarily as a normal amplifying transistor before to entering into the avalanche breakdown region. The delay time prior to entering this region of operation is a function of the transistor base drive current, temperature and the operating voltage and it can be seen that the closer the avalanche transistor can be brought to the inherent breakdown region, the shorter the indeterminate zone prior to avalanche.

With respect to pre-biasing circuit 50, the transistor 78 functions as a dedicated avalanche transistor and the ZTX415 device used in the embodiment shown is relatively inexpensive. The switching characteristics of avalanche transistor 78 are strongly influenced by the base drive signal. In general, the largest base drive current combined with the shortest current rise time produce the shortest delay to the avalanche conduction mode and the fastest rise time of the avalanche conduction mode. The parallel connected Schmitt trigger inverters 72 provide over 100 ma of drive current through resistor 76 in less than 1 nanosecond which produces a very fast transition to the avalanche conduction mode. Resistor 132 provides a current path to ground so that the avalanche transistor 78 can turn off after the charge storage capacitor 130 has been discharged. Resistor 124 provides a current return path during the charging of capacitor 130 and maintains a zero voltage across LED 26A until the circuit is "fired".

Schottky diode 126 and 128 serve a dual function. The first function is to conduct a pre-bias current sourced by transistor 84 so that the reverse bias on LED 26A is less than the reverse breakdown voltage. The pre-bias clamping voltage at node 93 is typically 1 volt while the reverse breakdown voltage is at least 3 volts. The second function of diode 126 and 128 is to clamp any transient voltage across the LED 26A that occurred when the circuit is fired. These transients are caused by the combined effect of the circuit inductance and the charge storage capacitor 130. Resistor 116 is of a relative small value and is used to shape the current pulse that flows through LED 26A.

A negative transitioning "fire" pulse is input to the pre-biasing circuit 50 on input 52 and is applied through resistor 60 to the input of Schmitt trigger inverter 62, which generates a delay of on the order of 5 nanoseconds. The resultant positive going transition at the output of Schmitt trigger inverter 62 is then applied to the input of Schmitt trigger inverter 64 which also has an inherent gate delay of about 5 nanoseconds. The negative going output signal from Schmitt trigger inverter 64 is then applied to the base of the transistor 84 which then turns it on. Transistor 84 has an inherent turn-on delay of approximately 50 nanoseconds so the total delay to the input "fire" pulse at input 52 through Schmitt trigger inverters 62, 64 and transistor 84 is a total of approximately 60 nanoseconds.

At this point, current through the clamping circuit comprising Schottky diodes 126 and 128 peaks out in a range of about 2 amps in a direction from capacitor 130 to circuit ground. Two series connected Schottky diodes 126 and 128, each rated at about 40 volts, are utilized due to the fact that the forward voltage swing on the LED 26A is about 60 volts when the clamping circuit is reverse biased.

The output of Schmitt trigger inverter 62 can be seen to also be applied to a delay circuit comprising resistor 66 and capacitor 68 which adds an approximately 40 nanosecond delay to the signal that is also applied to the input of Schmitt trigger inverter 64 in the pre-biasing portion of the pre-bias circuit 50. Schmitt trigger inverter 70 adds an additional 5 nanosecond delay and logic inversion for input to the three parallel-connected Schmitt trigger inverters 72. Collectively, the three parallel-connected Schmitt trigger inverters 72 add an additional 5 nanosecond signal delay and increase base drive current to the transistor 78. As a consequence, the turn-on of the avalanche transistor 78 begins at about 55 nanoseconds following the receipt of a "fire" pulse on input 52 while the turn-on of transistor 84 is completed approximately 60 nanoseconds thereafter. The full turn-on of avalanche transistor 78 includes an additional delay of approximately 8 to 10 nanoseconds before it hits avalanche, which then occurs substantially concurrently with the 60 nanosecond timing of the pre-biasing elements at the peak of the approximately 2 amp reverse current through the Schottky diodes 126 and 128.

In essence, the pre-bias circuit 50 functions to turn on the pre-bias transistor 84, which directly controls current of a controlled magnitude in a direction opposite to the primary forward current sufficient to overcome the undesired switching characteristics of the avalanche transistor 78 or other primary switching device. In conjunction with the very fast acting Schottky diode clamping circuit comprising, for example, diodes 126 and 128, when the magnitude of the primary forward current exceeds that of the pre-bias reverse current, the current through diodes 126 and 128 drops to zero abruptly. In other words, the clamping circuit snaps off. The primary forward current now flows through LED 26A, producing the light pulse. This transition to forward conduction occurs extremely rapidly, in a few tens to hundreds of pico-seconds, far faster than the avalanche transistor 78 can reach the avalanche conduction mode. The magnitude of the pre-bias reverse current, typically 2 amps, is set to be significantly greater than the current flowing through avalanche transistor 78 before the avalanche conduction mode is reached.

In operation, this then serves to eliminate the temperature and base drive dependent uncertainty zone of the avalanche transistor 78 and move the operating point closer to the avalanche region resulting in a transistor 78 effective turn-on time in the range of a few hundred picoseconds.

Stated another way, the function of the pre-biasing circuit 50 in conjunction with an otherwise conventional avalanche circuit is to place a pre-bias, on the order of 2 amps, in a very high speed clamping circuit comprising, for example, the pair of Schottky diodes 126 and 128 shown. In essence, the pre-biasing technique disclosed serves to eliminate the uncertainty zone in a conventional avalanche transistor circuit and the current is fully switched into the diode 26A with the speed of the Schottky diode clamping circuit in a sub-nanosecond timeframe.

The pre-bias circuit 50 of the present invention improves the performance of an avalanche or other "firing" circuits and provides an overall improvement in the accuracy of using a LED in a distance measurement and ranging instrument by removal of any uncertainty as to when the actual firing point occurs. The pre-biasing technique of the present invention improves the initial rate of rise in the current to the LED, and therefore improves the sharpness of the leading edge of the optical pulse generated thereby. Since a ranging device bases its timing of the distance traveled by the optical pulse upon the leading edge of the optical pulse, the present invention therefore improves the precision available for the device.

However, it understood that use of the pre-biasing technique disclosed herein is optional and a matter of design and performance choice dependant on the particular implementation of the distance and ranging device.

It is desirable to be able to take as a reference point in determining the time of flight of an optical pulse the mid-point of the current waveform zero timing reference rather than having to use an optical reference to determine emission pulse timing. By effectively eliminating the usual build-up current in a transistor avalanche circuit (which is, in practice, completely variable) an LED may then also be utilized in an accurate and precision distance measurement and ranging instrument that is extremely low cost. The pre-bias circuit and technique disclosed makes the best use of a firing circuit in high precision applications, especially in use with an LED in lieu of a laser diode.

Further, the utilization of an LED is not regulated by Federal Food and Drug Administration ("FDA") laser regulations and the power point setting is less critical allowing use a of much lower cost drive circuit components. By contrast, in the utilization of a laser diode, the power point must be carefully trimmed in order to achieve regulatory compliance.

In practice, LED pulses of less than 20 nanoseconds may be achieved utilizing the pre-bias circuit 50 disclosed despite specifications for the devices listing at least 40 or 50 nanosecond rise times. As a consequence, the pre-bias circuit 50 when used in conjunction with an LED for diode 26A may be used in industrial sensor and infrared "tape measure" applications. An LED is a more rugged and relatively larger optical source than a laser diode, which generally results in some difficulty in focusing the light source into a narrow beam. However, since the cost of a typical LED is in the range of $0.60–$0.70 each as opposed to that of a laser diode in the range of from $7.00 to up to $50.00 each, there are applications, such as the aforementioned industrial sensors and "tape measure" applications, where a broader beam width on the order of 1°–4° is acceptable. However, the accuracy of the measurement of distances through the calculation of the time of flight of an LED pulse would not be sufficient without the pre-bias circuit 50 above-described and the rapid application of a 40 amp pulse into an LED device.

FIG. 4 illustrates an embodiment of a MOSFET-based firing circuit 22B for LED 26B. The circuit has MOSFET 140, SCR 142, and high voltage capacitor 144. The anode of SCR 142 is coupled through resistor 146 to a high voltage supply line while the cathode of the SCR 142 is coupled to ground through a resistor 148. The gate of the SCR 142 is coupled to the trigger pulse and a resistor 150 can be provided to ground for providing a default control signal which disables the SCR.

The cathode of SCR 142 is also coupled to ground through a capacitor 152. MOSFET 140 has its gate coupled between the cathode of SCR 142 and resistor 148. The source of the MOSFET 140 is coupled to ground while the drain is coupled to the cathode of LED 26B. The anode of LED 26B is coupled through resistor 154 to another high voltage supply line, such as the high voltage supply 112 shown in FIG. 3. High voltage capacitor 142 is coupled between resistor 154 and the anode of LED 26B to ground.

In operation, when MOSFET 140 is turned off and LED 26B is not emitting an optical pulse, high voltage capacitor 144 charges to approximately the voltage of the high voltage supply. When the trigger pulse coupled to the gate of SCR 142 goes high, SCR 142 forward conducts which effectively provides a gate voltage to MOSFET 140 of approximately the voltage stored across capacitor 152 minus the voltage drop across SCR 142. Hence, the MOSFET 140 is turned on and conducts current from its drain to source through LED 26B which thereby generates the optical pulse therefrom.

While a pre-biasing circuit is not shown in FIG. 4, LED 26B can be optionally pre-biased with a reverse current or a reverse voltage in a similar manner shown in FIG. 3 with respect to LED 26A. Using such a pre-bias reverse current or reverse voltage would be one way to ensure that LED 26B would not generate any optical output until capacitor 144 had discharged a sufficient amount of forward current through LED 26B.

FIG. 5 illustrates an embodiment of an SCR-based firing circuit 22C for firing LED 26C in a distance measuring and ranging instrument. The circuit of FIG. 5 utilizes a silicon controlled rectifier (SCR) such as the commercially-available GA301 SCR. The circuit has an SCR 160, and a high voltage capacitor 162 for firing LED 26C.

The anode of SCR 160 is coupled through resistor 164 to a high voltage supply line, while the cathode of SCR 160 is coupled to ground. The control line or gate to SCR 160 is coupled to the trigger pulse of the distance measuring and ranging instrument. LED 26C has its anode coupled to ground and its cathode coupled to capacitor 162 which is also coupled to the high voltage supply line through resistor 164. A bypass resistor 166 is coupled from the cathode of LED 26C to ground.

In operation, when SCR 160 is off, capacitor 162 charges to approximately the voltage of the high voltage supply line through resistor 164. LED 26C is not conducting at this time. When the trigger pulse at the gate of SCR 160 goes active, then SCR 160 conducts from its anode to its cathode and capacitor 162 discharges through SCR 160. The discharge current flows from capacitor 162 through SCR 160 providing forward current through LED 26C which therefore generates an optical output.

The GA301 SCR is a commercially-available high speed SCR switch which can be used to generate approximately 30 nanosecond pulses.

While not shown in FIG. 5, LED 26C can also be optionally provided with a pre-bias reverse current or reverse voltage so that LED 26C generates an optical pulse only after the forward current has exceeded some predetermined value. In this manner, the resulting optical pulse from the distance measuring and ranging instrument will be sharper and more precise.

FIG. 6 illustrates an embodiment of a transistor-based firing circuit 22D for a distance measuring and ranging instrument utilizing an LED 26D and two discrete transistors 180 and 182 configured as a discrete SCR. The commercially-available ZTX951 PNP transistor can be used for transistor 180, while ZTX851 can be used for NPN transistor 182. The circuit of FIG. 6 is essentially identical to the circuit of FIG. 5, except that the SCR 160 of FIG. 5 has been replaced with the transistor pair 180, 182. This discrete implementation of the SCR is a less expensive alternative than the SCR described and shown in FIG. 5.

With respect to FIG. 6, PNP transistor 180 has its emitter coupled to a high voltage supply line through resistor 186. The base of transistor 180 is connected through resistor 188 to the emitter, and the base of transistor 180 is also coupled to the collector of NPN transistor 182. The collector of transistor 180 is coupled to the base of transistor 182 and to ground through resistor 190. The emitter of transistor 182 is also coupled to ground.

High voltage capacitor 184 is coupled to the high voltage supply line through resistor 186 and is also coupled to the emitter of transistor 180. The cathode of LED 26D is connected to capacitor 184 and the anode of LED 26D is coupled to ground. A bypass resistor 192 is coupled between the cathode of LED 26D and capacitor 184 to ground.

In operation, when transistors 180 and 182 are not conducting, capacitor 184 charges to approximately the supply voltage through resistor 186. LED 26D is not conducting or generating an optical output signal at this time. When a trigger pulse is applied to the base of transistor 182, transistor 182 conducts which effectively applies a ground potential to the base of PNP transistor 180, thereby activating transistor 180. Capacitor 184 therefore discharges its stored charge through both the emitter and collector of transistor 180 to ground through resistor 190, and through resistor 188 to ground through the collector and emitter of transistor 182. When capacitor 184 discharges, LED 26D receives a forward current and therefore generates an optical output.

The discrete SCR circuit 22D implementation can generate approximately 30 to 40 nanosecond light pulses from LED 26D.

While FIG. 6 does not show a pre-biasing circuit for LED 26D, it is understood that a reverse current or reverse voltage could be optionally applied to LED 26D so that the LED would not generate an optical pulse until the forward current was sufficiently high to generate a sharp leading edge of the LED's optical output pulse.

Figure 7:
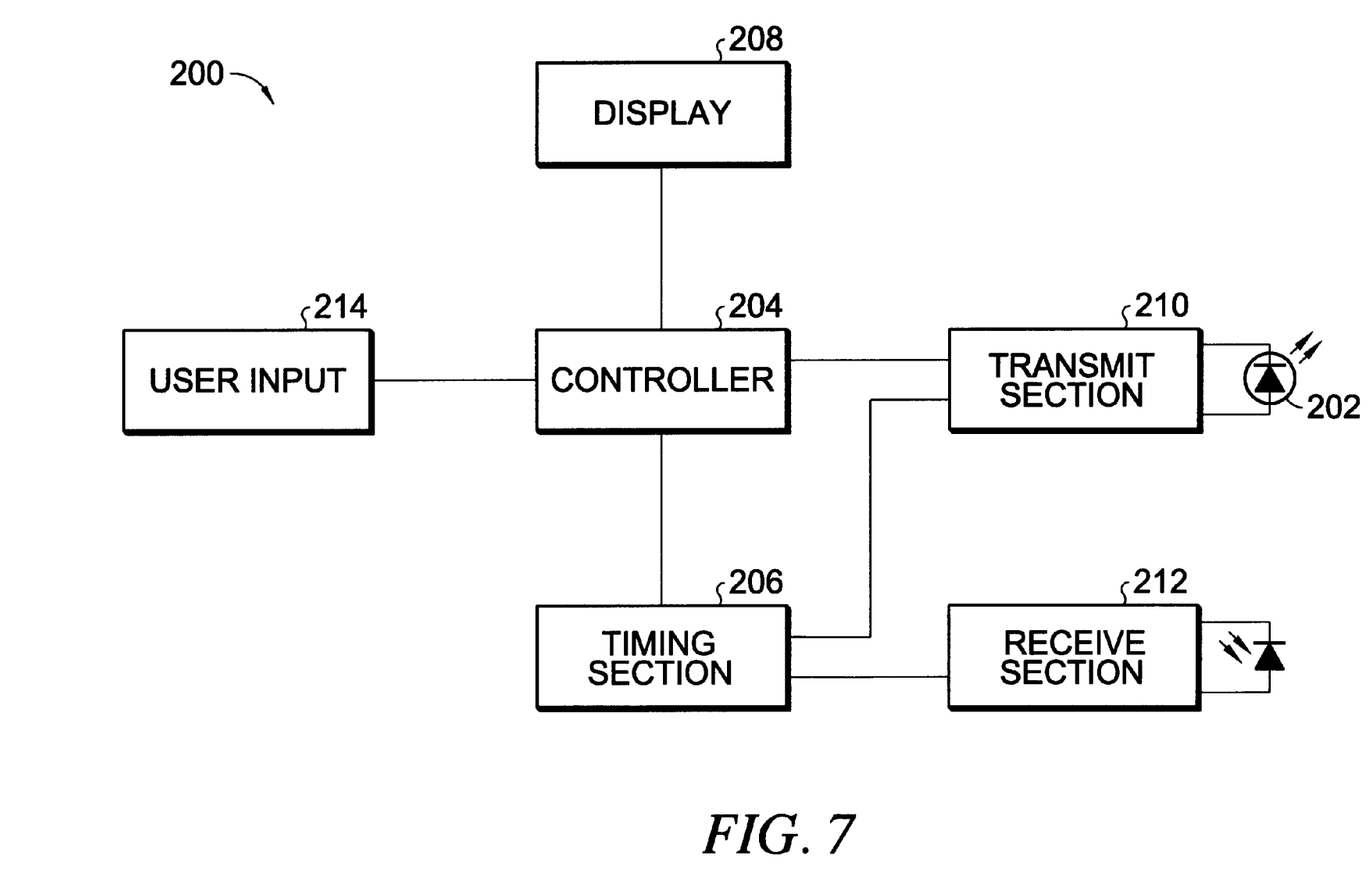
FIG. 7 is a block diagram of a distance and measuring instrument utilizing an LED as a transmitter in accordance with the present invention.

FIG. 7 illustrates a block diagram of one embodiment of a distance measuring and ranging instrument 200 utilizing and LED 202 in accordance with the present invention. The ranging device 200 includes a controller 204, a timing section 206, a display 208, a transmit section 210 with an LED 202, and a receive section 212. The controller is adapted to receive user input 214 (i.e., through a switch or other input device) for activating the ranging device and selecting its various operations.

The transmit section 210 of the ranging device utilizes an LED 202 for generating optical pulses directed towards a target. These optical pulses are discrete pulses whose reflections are received by the receive section of the ranging device. The transmit section shown in FIG. 7 can include a firing circuit, described above, to provide a short duration pulse of high relative peak power to drive the LED. The transmit section can also optionally include a pre-biasing section for applying a pre-bias signal to the LED prior to its firing.

A timing section 206 is coupled to the transmit section, the receive section, and a controller (i.e., a CPU, microcontroller, or microprocessor). The timing section detects and signals the controller of a flight time between transmission of the LED light pulse and reception of the LED light pulse reflected back from the target. The controller calculates the distance from the ranging device to the target and presents the relevant ranging information on a display which is coupled to the controller. The timing section in cooperation with the calculation functions available within the controller together form a ranging section for calculating a distance from the ranging device to the target. It is understood that the calculation functions performed by the controller and the timing functions performed by the timing section can be integrated in or distributed among any number of physical components without departing from the present invention.

While there have been described above the principles of the present invention in conjunction with specific circuitry and distance measurement and ranging instrument applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

What is claimed is:

1. An apparatus for measuring a distance to a target, comprising:
    a transmit circuit section for generating a light pulse, comprising:
        a non-laser light-emitting diode element for generating said light pulse; and
        a firing circuit, coupled to said non-laser light-emitting diode element, for applying a firing signal to said light-emitting diode element to generate said light pulse;
        a pre-biasing circuit, coupled to said light-emitting diode element, for providing a reverse-bias signal to said light-emitting diode element;
    a receive circuit section for detecting a reflection of said light pulse from said target; and
    a ranging section for calculating a distance from said ranging device to said target based on a flight time of said light pulse to and from said target.

2. The apparatus of claim 1, wherein said firing circuit is comprised of an avalanche transistor switching a current pulse through said light-emitting diode element.

3. The apparatus of claim 1, wherein said firing circuit is comprised of a MOSFET element switching a current pulse through said light-emitting diode element.

4. The apparatus of claim 1, wherein said firing circuit is comprised of a SCR element switching a current pulse through said light-emitting diode element.

5. The apparatus of claim 1, wherein said firing circuit is comprised of a pair of transistors configured as an SCR element for switching a current pulse through said light-emitting diode element.

6. The apparatus of claim 1, wherein said ranging section comprises:
    a timing section for detecting a flight time of said light pulse to and from said target; and
    a controller coupled to said timing section, said controller calculating the flight time of said light pulse to and from said target.

* * * * *